United States Patent
Lin et al.

(10) Patent No.: US 7,920,085 B2
(45) Date of Patent: Apr. 5, 2011

(54) METHOD AND SYSTEM FOR ANALOG-TO-DIGITAL CONVERSION

(75) Inventors: Wei Ping Lin, Shanghai (CN); Wen Zhe Luo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/582,691

(22) Filed: Oct. 20, 2009

(65) Prior Publication Data

US 2010/0182177 A1   Jul. 22, 2010

(30) Foreign Application Priority Data

Dec. 31, 2008   (CN) .......................... 2008 1 0205384

(51) Int. Cl.
*H03M 1/12* (2006.01)

(52) U.S. Cl. ........ 341/172; 341/122; 341/143; 341/155; 341/161; 341/162

(58) Field of Classification Search .......... 341/118–121, 341/155, 161, 162, 172
See application file for complete search history.

(56) References Cited

U.S. PATENT DOCUMENTS

| | | | | |
|---|---|---|---|---|
| 5,892,473 A * | 4/1999 | Shin | | 341/150 |
| 5,963,156 A * | 10/1999 | Lewicki et al. | | 341/122 |
| 6,097,326 A * | 8/2000 | Opris et al. | | 341/161 |
| 6,166,675 A * | 12/2000 | Bright | | 341/162 |
| 6,249,240 B1 * | 6/2001 | Bellaouar | | 341/172 |
| 6,323,800 B1 * | 11/2001 | Chiang | | 341/161 |
| 6,653,976 B1 * | 11/2003 | Janky | | 342/386 |
| 6,967,611 B2 * | 11/2005 | Atriss et al. | | 341/172 |
| 6,977,606 B2 * | 12/2005 | Daito | | 341/161 |
| 7,009,549 B1 * | 3/2006 | Corsi | | 341/161 |
| 7,515,086 B2 * | 4/2009 | Ryu | | 341/161 |
| 7,576,677 B2 * | 8/2009 | Morimoto | | 341/162 |
| 7,746,260 B1 * | 6/2010 | Tu et al. | | 341/144 |

* cited by examiner

*Primary Examiner* — Linh V Nguyen
(74) *Attorney, Agent, or Firm* — Kilpatrick Townsend and Stockton LLP

(57) ABSTRACT

Method and system for analog-to-digital conversion. According to an embodiment, the present invention provides an integrated circuit. The integrated circuit includes a different operational amplifier, which includes a first output, a second output, a first input, and a second input. The operational amplifier is associated with an amplification factor. The integrated circuit also includes a first voltage input. The first voltage input can be characterized by a first voltage. Additionally, the integrated circuit includes a second voltage input. The second voltage input can be characterized by a second voltage. Furthermore, the integrated circuit includes a first voltage source configured to provide a first reference voltage. In addition, the integrated circuit includes a second voltage source configured to provide a second reference voltage. Furthermore, the integrated circuit includes a first capacitor being electrically coupled to the first input and disengageably coupled to the first voltage input.

20 Claims, 8 Drawing Sheets

METHOD AND SYSTEM FOR ANALOG-TO-DIGITAL CONVERSION

CROSS-REFERENCES TO RELATED APPLICATIONS

This application claims priority to Chinese Patent Application No. 200810205384.5 filed Dec. 31, 2008, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a system and method for analog-to-digital conversion. Merely by way of example, the invention has been pipelined analog-to-digital converter used in high speed application. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size. For example, one of design challenges is to provide quality analog-to-digital converters (ADC) on integrated circuits.

An ADC is an electronic device that receives an analog input signals (e.g., voltage reading, etc.) and converts the analog reading into a digital reading. For example, an ADC converts a voltage reading into a digital number. Typically, an ADC continuously converts input signals into digital reading.

An ADC has a wide range of applications. Over the past, various types of ADCs have been developed. For example, direct conversion ADCs, successive-approximation ADCs, delta-encoded ADCs, ramp-compare ADCs, and Sigma-Delta ADCs have been used for a variety of applications.

More recently, pipeline ADCs have been implemented in ICs to provide a solution for applications requiring high speed analog-to-digital conversion. Also known as subranging quantizer, a pipeline ADC utilizes a two-step process for analog-to-digital conversion. First, a coarse conversion is performed. For example, a comparison is made between an analog input voltage and a reference voltage. Next, a fine conversion is performed. The results from the coarse and fine conversions are combined to provide a result (e.g., a two big digital output). Typically, a pipeline ADC is able to provide a digital output within two clock cycles (e.g., one for coarse conversion, and one for fine conversion). To further speed up the conversion process, multiple ADCs are often used together.

Like other types of ADCs, the pipeline ADCs face various design challenges. For example, problems such as quantization errors, non-linearity, and aperture error, often limit ADC performance (e.g., accuracy, power consumption, size, etc.). In the past, various conventional techniques have been developed for pipeline ADCs. Unfortunately, convention techniques are often inadequate.

Therefore, it is desirable to have an improved method and system for analog-to-digital converters.

BRIEF SUMMARY OF THE INVENTION

The present invention is directed to integrated circuits. More particularly, the invention provides a system and method for analog-to-digital conversion. Merely by way of example, the invention has been pipelined analog-to-digital converter used in high speed application. But it would be recognized that the invention has a much broader range of applicability.

According to an embodiment, the present invention provides an integrated circuit. The integrated circuit includes a different operational amplifier, which includes a first output, a second output, a first input, and a second input. The operational amplifier is associated with an amplification factor. The integrated circuit also includes a first voltage input. The first voltage input can be characterized by a first voltage. Additionally, the integrated circuit includes a second voltage input. The second voltage input can be characterized by a second voltage. Furthermore, the integrated circuit includes a first voltage source configured to provide a first reference voltage. In addition, the integrated circuit includes a second voltage source configured to provide a second reference voltage. Furthermore, the integrated circuit includes a first capacitor being electrically coupled to the first input and disengageably coupled to the first voltage input. For example, the coupling to the first voltage input being is with a first clock signal. Moreover, the integrated circuit includes a second capacitor being electrically coupled to the first input and disengageably coupled to the first voltage input. The coupling to the first voltage input is associated with the first clock signal. In addition, the integrated circuit includes a third capacitor being electrically coupled to the second input and disengageably coupled to the second voltage input. The coupling to the second voltage input is associated with the first clock signal. The integrated circuit also includes a fourth capacitor being electrically coupled to the second input and disengageably coupled to the second voltage input. Depending upon application, the coupling to the second voltage input is associated with the first clock signal.

Moreover, the integrated circuit includes a first switch including a first switching position and a second switching position. The integrated circuit also includes a second switch including a third switching position and a third switching position. If the first switch is at the first switching position, the first capacitor is disengageably coupled to the first output and the second capacitor is disengageably coupled to the first voltage source. If the first switch is at the second switching position, the first capacitor is disengageably coupled to the first voltage source and the second capacitor is disengageably coupled to the first output. If the second switch is at the third switching position, the third capacitor is disengageably coupled to the second output and the second capacitor is disengageably coupled to the second voltage source. If the second switch is at the fourth switching position, the third capacitor is disengageably coupled to the second voltage source and the second capacitor is disengageably coupled to the second output.

According to another embodiment, the present invention provides a method for determining an optimal configuration for an integrated circuit. The method includes a step for providing the integrated circuit. The integrated circuit includes a differential operational amplifier including a first output, a second output, a first input, and a second input. For example, the operational amplifier is associated with an amplification factor. The integrated circuit also includes a first voltage input, which can be characterized by a first voltage. Additionally, the integrated circuit includes a second voltage input, which can be characterized by a second voltage. The integrated circuit additionally includes a first voltage source configured to provide a first reference voltage. The integrated circuit also includes a second voltage source configured to provide a second reference voltage. Moreover, the integrated circuit includes a first capacitor that is electrically coupled to the first input and disengageably coupled to the first voltage input. Additionally, the integrated circuit includes a second capacitor that is electrically coupled to the first input and disengageably coupled to the first voltage input. Additionally, the integrated circuit includes a third capacitor that is electrically coupled to the second input and disengageably coupled to the second voltage input. Additionally, the integrated circuit includes a fourth capacitor that is electrically coupled to the second input and disengageably coupled to the second voltage input.

In addition, the integrated circuit includes a first switch that includes a first switching position and a second switching position. Moreover, the integrated circuit includes a second switch that includes a third switching position and a third switching position. If the first switch is at the first switching position, the first capacitor is disengageably coupled to the first output and the second capacitor is disengageably coupled to the first voltage source. If the first switch is at the second switching position, the first capacitor is disengageably coupled to the first voltage source and the second capacitor is disengageably coupled to the first output. If the second switch is at the third switching position, the third capacitor is disengageably coupled to the second output and the second capacitor is disengageably coupled to the second voltage source. If the second switch is at the fourth switching position, the third capacitor is disengageably coupled to the second voltage source and the second capacitor is disengageably coupled to the second output.

The method further includes a step for selecting a first configuration, wherein the first switch is at the first switching position and the second switch is the third switching position. The method also includes a step for determining a first output deviation associated with the first configuration. The method additionally includes a step for selecting a second configuration, wherein the first switch is at the second switching position and the second switch is the third switching position. The method further includes a step for determining a second output deviation associated with the second configuration. The method additionally includes a step for selecting a third configuration, wherein the first switch is at the first switching position and the second switch is the fourth switching position. The method includes a step for determining a third output deviation associated with the third configuration. The method also includes a step for selecting a fourth configuration, wherein the first switch is at the second switching position and the second switch is the fourth switching position. The method additionally includes a step for determining a fourth output deviation associated with the fourth configuration. Furthermore, the method includes a step for selecting an optimal configuration based on the first, second, third, and fourth output deviations.

According to yet another appointment, the present invention provides a method for determining an optimal configuration for an integrated circuit. The method includes a step for providing the integrated circuit. The integrated circuit includes a different operational amplifier including a first output, a second output, a first input, and a second input. The operational amplifier is associated with an amplification factor. The integrated circuit also includes a first voltage input that can be characterized by a first voltage. The integrated circuit includes a second voltage input that can be characterized by a second voltage. The integrated circuit additionally includes a first voltage source configured to provide a first reference voltage. The integrated circuit also includes a second voltage source configured to provide a second reference voltage. The integrated circuit additionally includes a first capacitor that is electrically coupled to the first input and disengageably coupled to the first voltage input. The integrated circuit includes a second capacitor that is electrically coupled to the first input and disengageably coupled to the first voltage input. The integrated circuit additionally includes a third capacitor that is electrically coupled to the second input and disengageably coupled to the second voltage input. The integrated circuit includes a fourth capacitor that is electrically coupled to the second input and disengageably coupled to the second voltage input.

The method additionally includes a step for providing a switch matrix adjustment configured to provide four or more configurations. If a first configuration is selected, the first capacitor is disengageably coupled to the first output, the second capacitor is disengageably coupled to the first reference voltage, the third capacitor is disengageably coupled to the second output, and the fourth capacitor is disengageably coupled to the second reference voltage. If a second configuration is selected, the first capacitor is disengageably coupled to the first reference voltage, the second capacitor is disengageably coupled to the first output, the third capacitor is disengageably coupled to the second output, and the fourth capacitor is disengageably coupled to the second reference voltage. If a third configuration is selected, the first capacitor is disengageably coupled to the first output, the second capacitor is disengageably coupled to the first reference voltage, the third capacitor is disengageably coupled to the second reference voltage, and the fourth capacitor is disengageably coupled to the second output. If a first configuration is selected, the first capacitor is disengageably coupled to the first reference voltage, the second capacitor is disengageably coupled to the first output, the third capacitor is disengageably coupled to the second reference voltage, and the fourth capacitor is disengageably coupled to the second output. Additionally, the method includes a step for selecting an optimal configuration from the four or more configurations.

The previous invention provides various advantages over conventional techniques. According to various embodiments, the present provides a system and method for ADCs with a higher degree of accuracy, uniformity, and linearity. More specifically, various embodiments of the present invention allow improving ADC performance after the ADC has been manufactured. In addition, various embodiments of the present invention provide power saving for ADC units by allowing ADCs to be implemented with smaller capacitor components. There are other benefits as well.

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention is directed to integrated circuits. More particularly, the invention provides a system and method for analog-to-digital conversion. Merely by way of example, the invention has been pipelined analog-to-digital converter used in high speed application. But it would be recognized that the invention has a much broader range of applicability.

As described above, pipeline ADC designing faces various challenges. Among other things, non-linearity of causes problems, such as inaccuracy, pipeline ADCs. A common source of non-linearity is non-uniformity of physical components (such as resistor, capacitor, etc.) used to implement pipeline ADCs. As the ICs become smaller, it has been increasingly difficult to manufacture physical components with high uniformity. Therefore it is to be appreciated that, everything else being equal, various embodiments of the present invention provides a technique for implementing highly accurate and linear ADCs.

Figure 1:
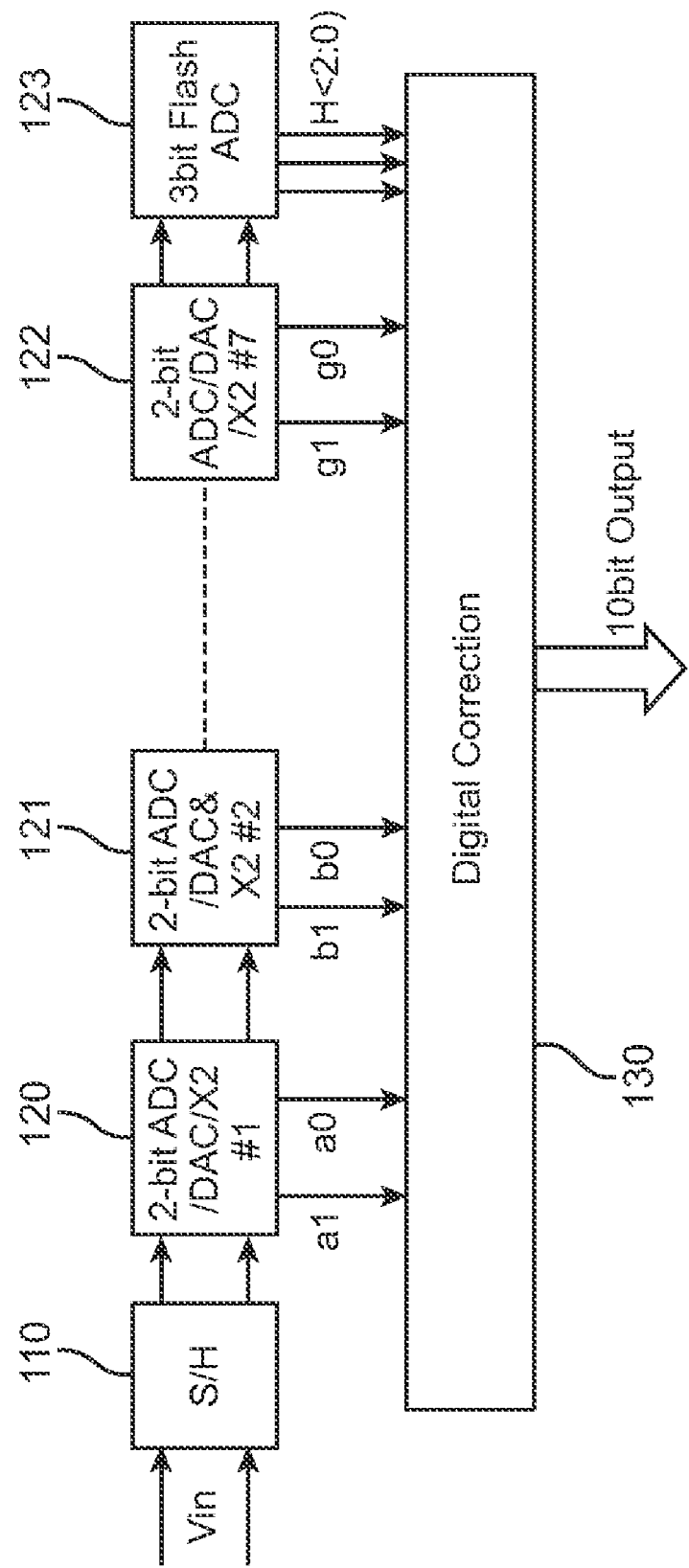
FIG. 1 is a simplified diagram illustrating a ten bit pipelined ADC.

FIG. 1 is a simplified diagram illustrating a ten bit pipelined ADC. This diagram is merely an example, which should not unduly limit the scope of the claims. One of ordinary skill in the art would recognize many variations, alternatives, and modifications. An ADC 100 includes a sample and hold (S/H) unit 110, cascaded ADC/X2 blocks, a 3-bit flash ADC 123, and a digital correction block 130. For example, each of the ADC/X2 blocks conducts a coarse 2-bit ADC and generates 2-bit digital result. The digital correction block 130 uses the 2-bit digital results from the ADC/X2 blocks to generate a final result. The ADC/X2 block 120, which is the first ADC/X2 block to receive an input, produces the most significant digitals. The ADC/X2 block 122, which is the last ADC/X2 block to receive an input, produces the least significant digitals.

For the pipeline ADC 100 to work, ADC/X2 blocks are cascade. The result of a comparison (between the input and a reference voltage) from one ADC/X2 block becomes the input voltage reading of the next ADC/X2 block after amplification. Typically, the output signal carries a signal strength that is twice as large as the input signal. As a result, the each succeeding ADC/X2 blocks receive an input signal that is easier to read. For example, for an input reading of 110 in binary, a first ADC/X2 blocks compares 010 to 100, determines that 010 is less than 100, and produces an output of 100 (010x2) for the next ADC/X2. In such a manner, identical ADC/X2 blocks can be used in the ADC 100.

Figure 2:
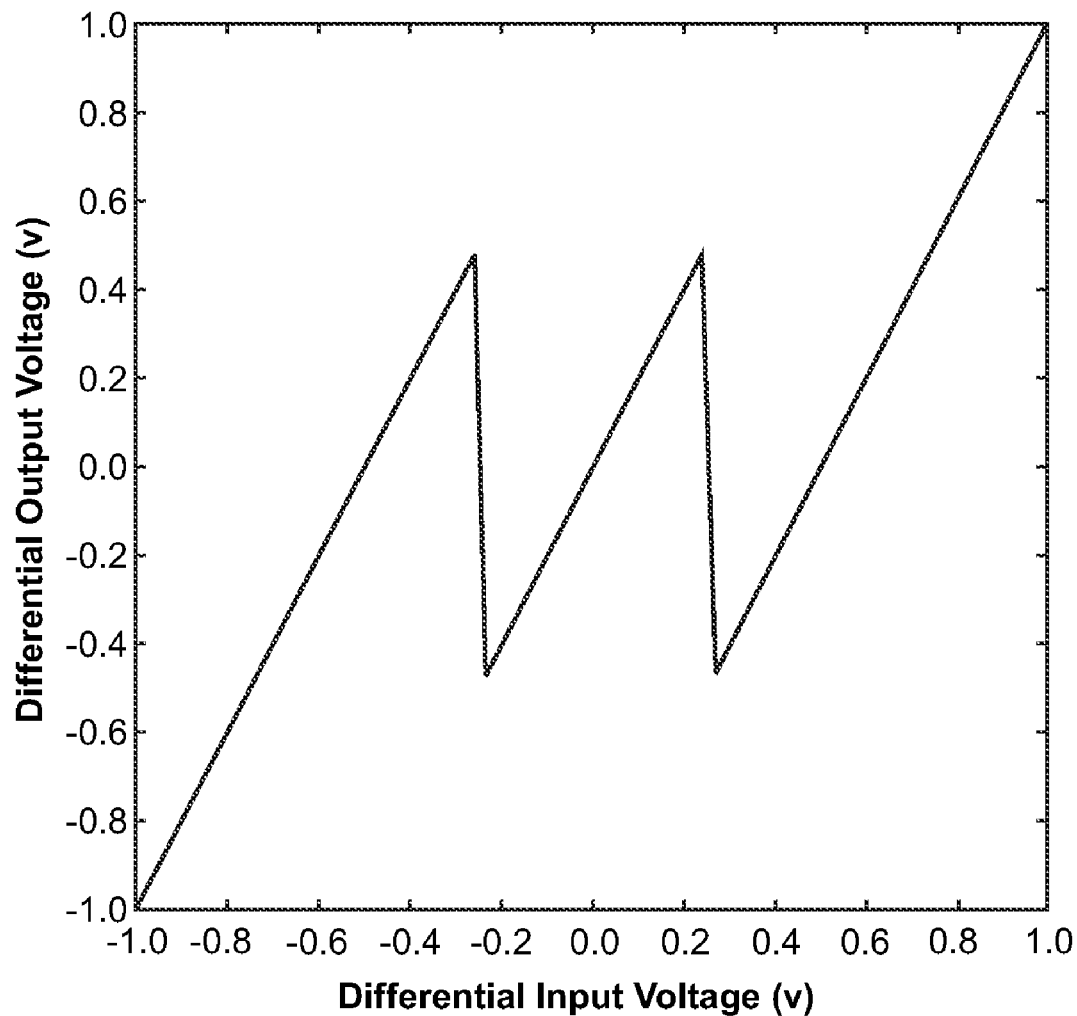
FIG. 2 is a simplified diagram illustrating an ideal transfer function between each stage of ADC/X2 blocks.

FIG. 2 is a simplified diagram illustrating an ideal transfer function between each stage of ADC/X2 blocks. This diagram is merely an example, which should not unduly limit the scope of the claims. One of ordinary skill in the art would recognize many variations, alternatives, and modifications. In FIG. 2, the x-axis represents the differential input for each ADC/X2 block, and the y-axis represents the differential output of each ADC/X2 block. As explained above, the ideal relationship between input and output voltage level is times 2 (i.e., output is twice of the input). Therefore, as shown in FIG. 2, the slope of the ideal transfer curve is 2 (i.e., output is twice of the input, or y value is twice of x value).

Unfortunately, in actually implementation, the transfer function between input and output often deviates from the ideal transfer function curve. Such deviation can be attributed to non-uniformity of physical components and often contributes to non-linearity and inaccuracy of the ADC. Among other things, capacitors used to implement the ADC/X2 block are often non-uniform and causes non-linearity for ADC performance.

Figure 3:
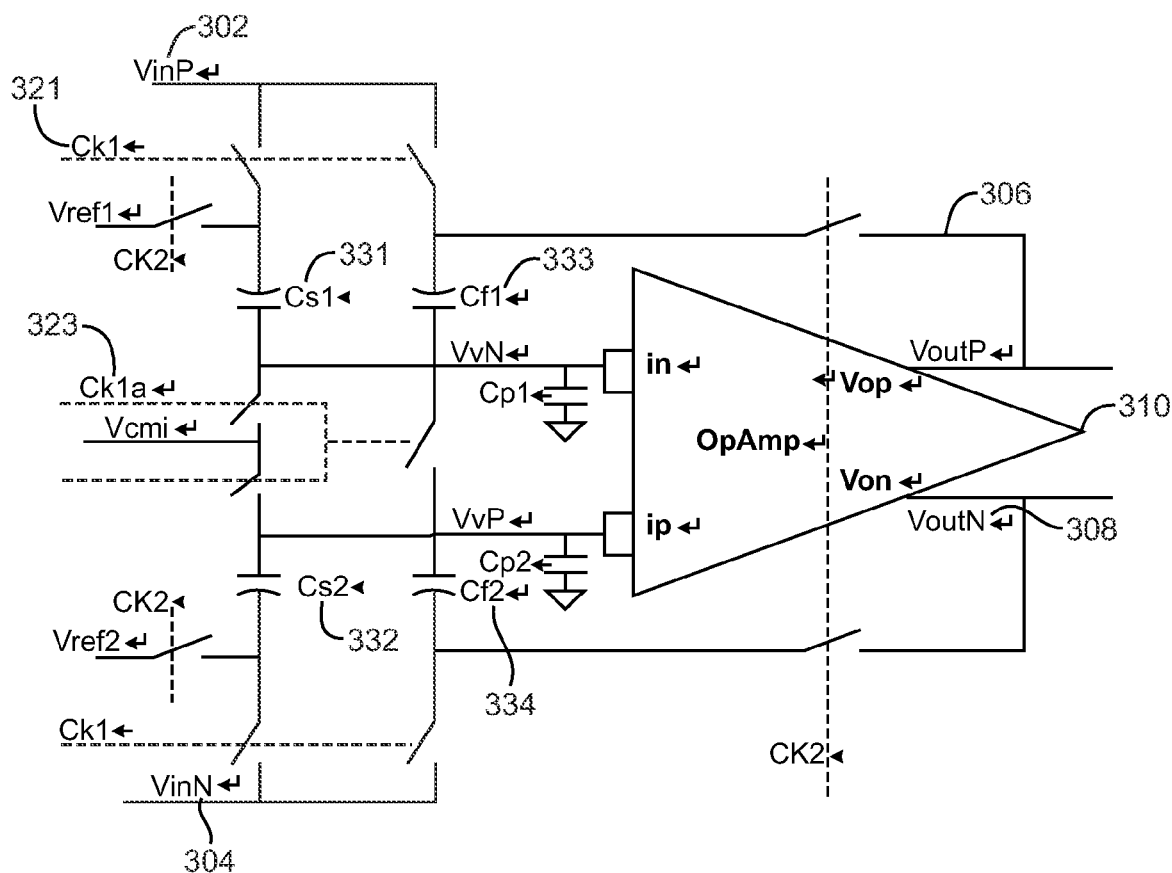
FIG. 3 is a simplified diagram of a conventional ADC/X2 block.

FIG. 3 is a simplified diagram of a conventional ADC/X2 block. This diagram is merely an example, which should not unduly limit the scope of the claims. One of ordinary skill in the art would recognize many variations, alternatives, and modifications. The ADC/X2 block 300 includes, among other things, a differential operational amplifier (op-amp) 310, capacitors 331, 332, 333, and 334. Typically, because the capacitors are used to store and compare voltages, it is desirable for capacitors to have substantially the same capacitance. The ADC/X2 block 300 receives clock inputs 321 and 322. For example, clock inputs 321 and 322 are non-overlapping clock signals. For input, during a clock cycle of the clock input 321, the capacitors 331, 332, 333, and 334 respectively sample the differential input signals VinP 302 and VinN 304 as shown in FIG. 3. The clock input 323 is substantially the same as the clock input 321, except that the clock input 323 has a phase is a bit ahead of the clock input 323 to reduce charge injections. During a clock cycle of the clock input 322, the capacitors 333 and 334 are respectively connected to VoutP and VoutN. the capacitors 333 and 334 transfer the charges onto the output to realize the X2 function. The voltage difference between VoutP 306 and VoutN 308 is used as the output to the next ADC/X2 block.

The mechanism for the ADC/X2 block 300 can be explained with mathematical equations.

Due to charge conservation, charges stored at the nodes VvN and VvP are equal before and after the falling edge of Ck1a. This relationship can expressed as the following equations:

$$(VinP-Vcmi)*(Cs1+Cf1)+(0-Vcmi)*Cp1=(Vref1-VvN)*Cs1+(VoutP-VvN)*Cf1+(0-VvN)*Cp1 \quad \text{(Equation 1)}$$

$$(VinN-Vcmi)*(Cs2+Cf2)+(0-Vcmi)*Cp2=(Vref2-VvP)*Cs2+(VoutN-VvP)*Cf2+(0-VvP)*Cp2 \quad \text{(Equation 2)}$$

Assuming that $Cs1=Cs2=Cs$, $Cf1=Cf2=Cf$, $Cp1=Cp2=Cp$, the following equations are derived:

$$(VinP-VinN)*(Cs+Cf)=(Vref1-Vref2)*Cs+(VoutP-VoutN)*Cf+(VvP-VvN)*(Cs+Cf+Cp) \quad \text{(Equation 3)}$$

$$(VoutP-VoutN)*Cf=(VinP-VinN)*(Cs+Cf)-(Vref1-Vref2)*Cs-(VvP-VvN)*(Cs+Cf+Cp) \quad \text{(Equation 4)}$$

Since the op-amp 310 is a differential amplifier, the output Vout can be expressed as Vout=VoutP−VoutN. Assuming that (VoutP-VoutN)=Av*(VvP-VvN) according to Op-Amp's functionality, the following equations can be derived:

$$Vout=(VinP-VinN)*(Cs+Cf)/Cf-(Vref1-Vref2)*Cs/Cf-\text{out}*(Cs+Cf+Cp)/(Av*Cf) \quad \text{(Equation 5)}$$

$$Vout=(VinP-VinN)*(Cs+Cf)/\{Cf*[1+(Cs+Cf+Cp)/(Cf*Av)]\}-(Vref1-Vref2)*Cs/\{Cf*[1+(Cs+Cf+Cp)/(Cf*Av)]\} \quad \text{(Equation 6)}$$

As Equation 6 demonstrates, the output of each ADC/X2 block is related to the capacitors. More specifically, the transfer function that amplifies the output voltage by a factor of two relies on the capacitor divider relationship (Cs+Cf)/Cf. Ideally, Cs and Cf are the same, and the capacitor divider relationship yields the following equation:

$$(Cs+Cf)/Cf=(Cf+C0)/Cf=2Cf/Cf=2$$

Figure 4:
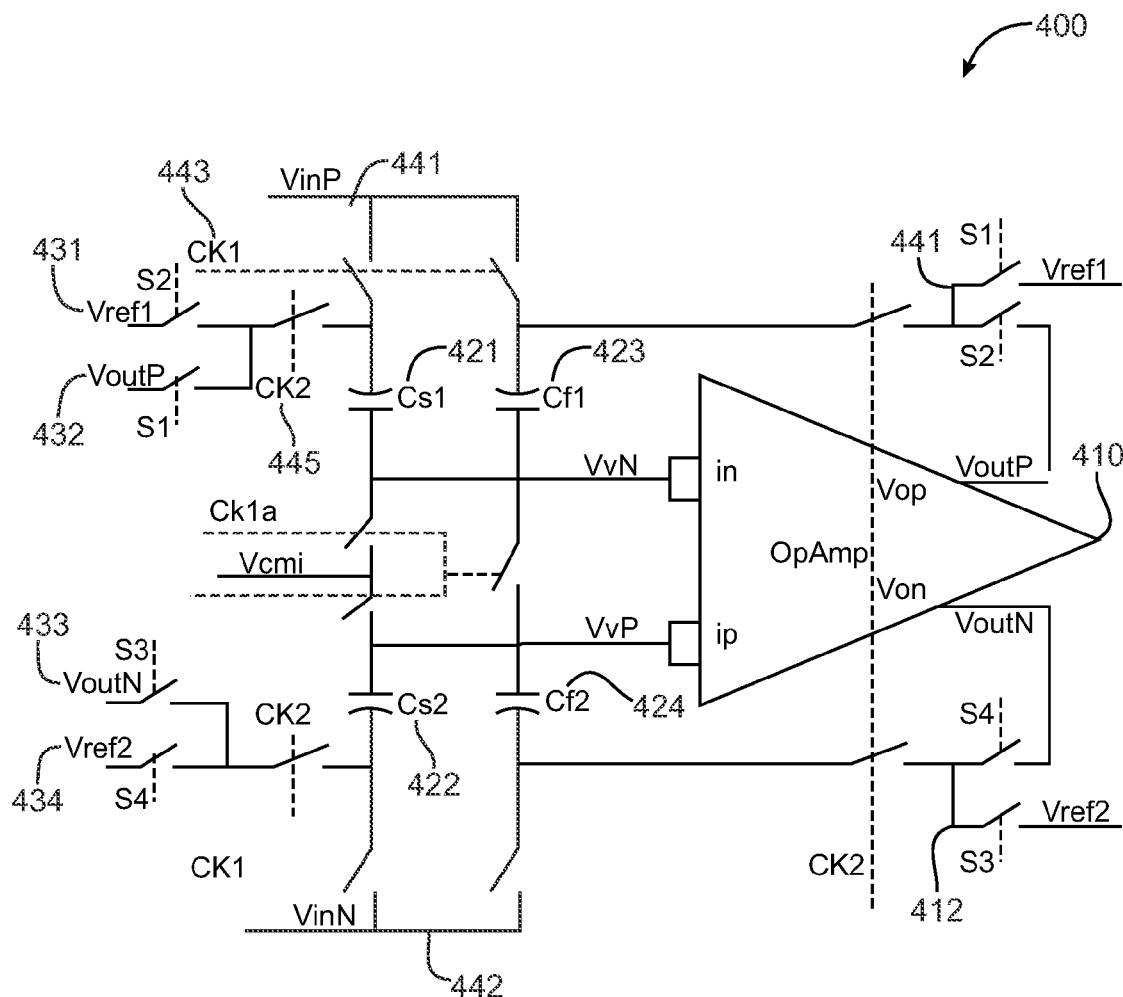
FIG. 4 is a simplified diagram illustrating an analog-to-digital conversion component according to an embodiment of the present invention.

Unfortunately, capacitors vary in capacitance. The mismatched capacitance among capacitor in ADC often leads to non-linearity and ultimately inaccuracy. For example, for a 10-bit ADC, the difference in capacitance among capacitors must be less than 0.1% to ensure proper functioning of the ADC. As integrated circuits becomes smaller in size, matching capacitance among capacitors becomes more challenging. Therefore, it is to be appreciated that various embodiments of the present invention provide, among other things, a new and improved system and method to improve capacitor uniformity and ADC accuracy. Furthermore, it is to be appreciated that the present invention allows capacitance matching after FIG. 4 is a simplified diagram illustrating an analog-to-digital conversion component according to an embodiment of the present invention. This diagram is merely an example, which should not unduly limit the scope of the claims. One of ordinary skill in the art would recognize many variations, alternatives, and modifications. An analog-to-digital conversion (ADC) component 400 includes a differential op-amp 410, switches 411 and 412, capacitors 421, 422, 423, and 424, and clocks inputs 443, 444, and 445. For example, the ADC component 400 is the ADC/X2 component used in the ADC 100. As explained above, it is desirable for capacitors to have equal capacitance. However, due to limitations in manufacturing, capacitors have different capacitances. It is to be appreciated that according to various embodiments, the present invention provides flexibility in matching and adjust capacitance after and ADC has already been manufactured.

As seen in FIG. 4, the ADC component 400 includes switches 411 and 412. Each of the switches provides two selectable configuration for capacitors. For example, when the switch 411 is at the first position, the capacitor 421 is disengageably coupled to VoutP 432, and the capacitor 423 is disengageably coupled to Vref1 431; when the switch 411 is at the second position, the capacitor 421 is disengageably coupled to Vref1 431, and the capacitor 423 is disengageably coupled to VoutP 432. Similar, the switch 412 provides two configurations as well. When the switch 412 is at the first position, the capacitor 424 is disengageably coupled to Vref2 434, and the capacitor 422 is disengageably coupled to VoutN 433; when the switch 412 is at the second position, the capacitor 424 is disengageably coupled to VoutN 433, and the capacitor 422 is disengageably coupled to Vref2 434.

Since each switch offers two configuration, the two switches provides four possible combinations. Each possible combination can be used to provide a capacitor divider function as illustrated in Equation 6 and provide a voltage multiplier by a factor of two. According to an embodiment, a testing process is used to identify the best configuration for a give set of four capacitors on an ADC component. For example, a test is conducted for each combination, and the combination with the best outcome (i.e., smallest deviation) is used the selected combination for the ADC component.

Figure 5:
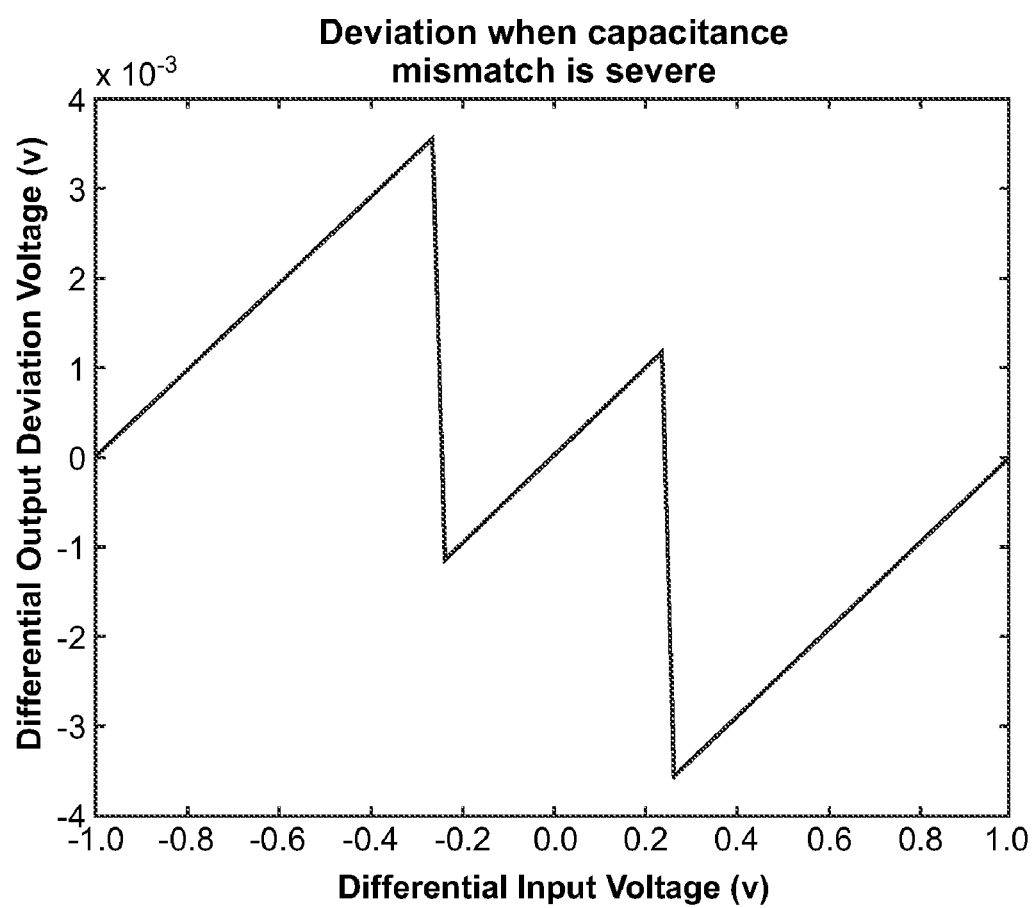
FIGS. 5-6 are graphs illustrating differential voltages outputs for an ADC component with different combinations according to an embodiment of the present invention.
Figure 6:
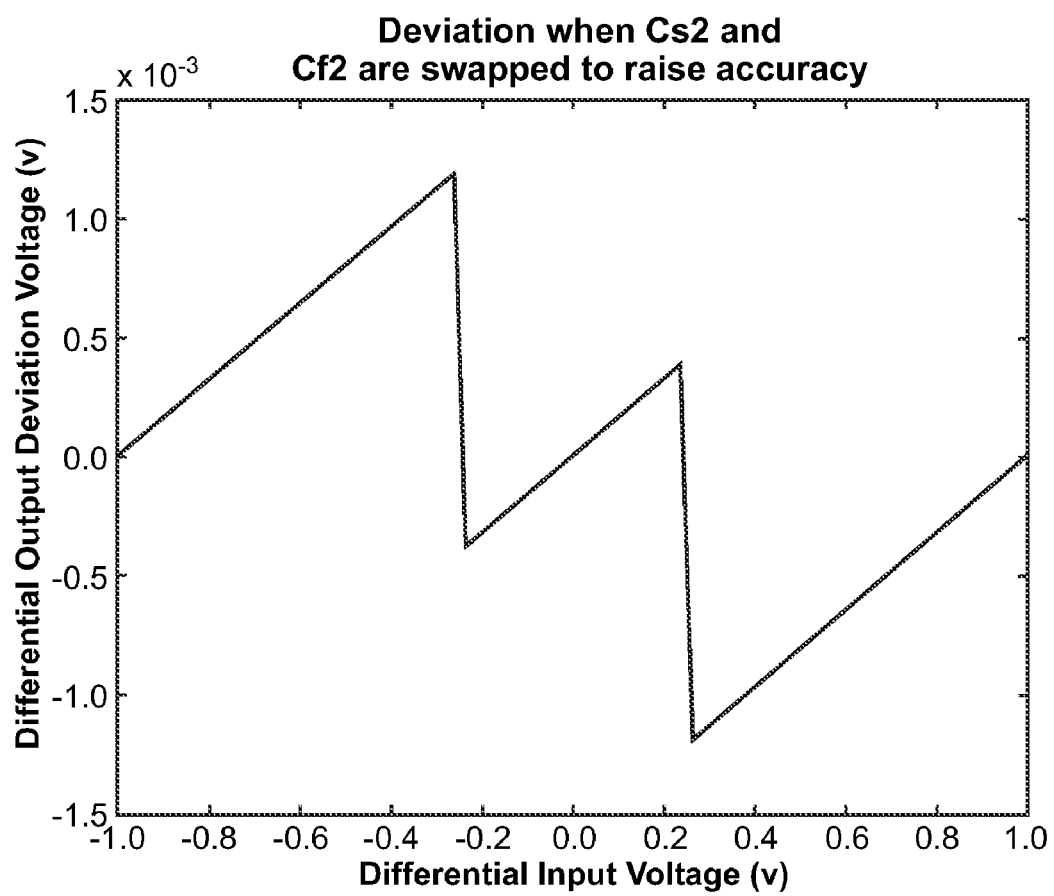

FIGS. 5-6 are graphs illustrating differential voltages outputs for an ADC component with different combinations according to an embodiment of the present invention. These merely provide an example, which should not unduly limit the scope of the claims. One of ordinary skill in the art would recognize many variations, alternatives, and modifications. The graph in FIG. 5 illustrates deviation level of differential output caused by severely mismatched capacitors. As can be seen in FIG. 5, the deviation level can be as high as 4 mV. The graph in FIG. 6 illustrates the deviation level of differential output when sample capacitors have greater capacitance than feedback capacitance (Cs>Cf). As can be seen in FIG. 6, the deviation level can be as high as 2.5 mV.

Figure 7:
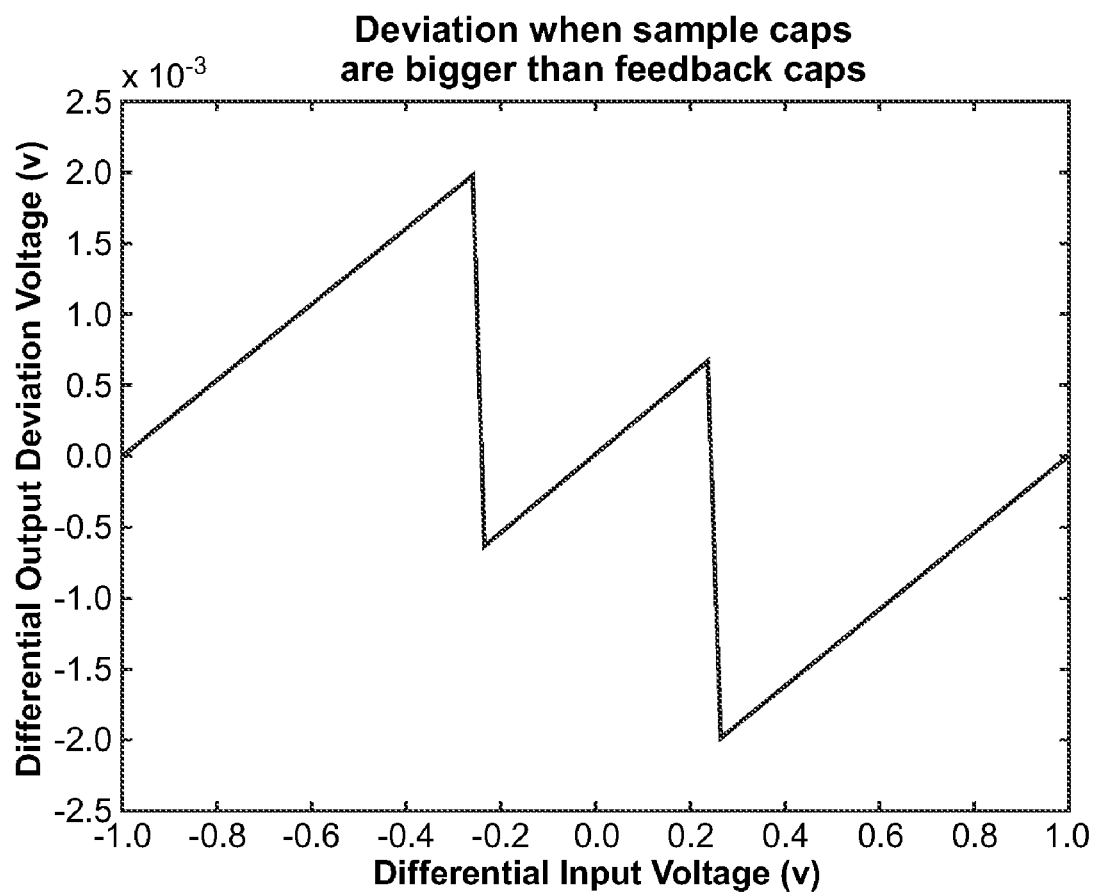
Figure 8:
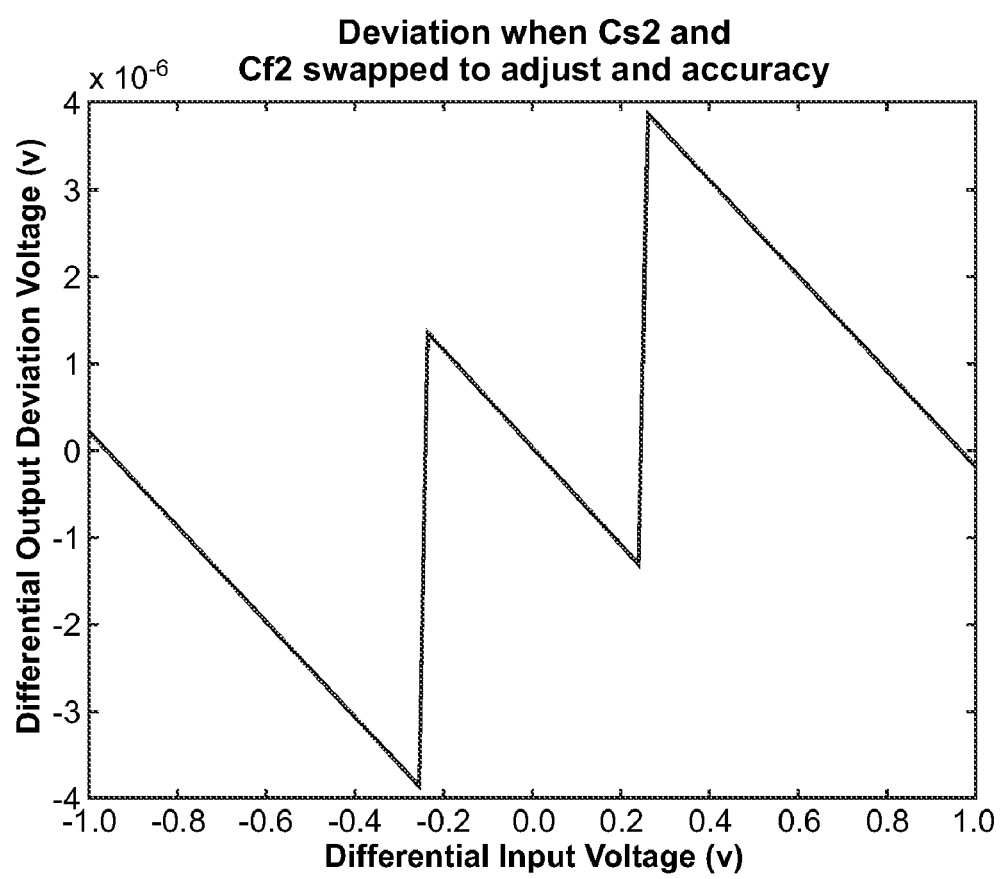

In a specific embodiment (e.g., the ADC component 400), the present invention significantly reduces the deviation level. As shown in FIG. 7, the deviation in differential output is reduced to 1.5 mV by using an alternative capacitor configuration achieved by using different switching configurations. For example, the graph in FIG. 7 illustrates reduced deviation level achieved by switching a sample capacitor and a feedback transistor. With yet another alternative capacitor configuration, even a lower deviation level can be achieved. The graph in FIG. 8 shows the deviation level for an optimal capacitor configuration. As the graph illustrates, the deviation level can be as low as below 4 uV, which is about a thousand times lower than deviation level from capacitor configuration with severe capacitor mismatch.

According to an embodiment, the present invention provides an integrated circuit. The integrated circuit includes a different operational amplifier, which includes a first output, a second output, a first input, and a second input. The operational amplifier is associated with an amplification factor. The integrated circuit also includes a first voltage input. The first voltage input can be characterized by a first voltage. Additionally, the integrated circuit includes a second voltage input. The second voltage input can be characterized by a second voltage. Furthermore, the integrated circuit includes a first voltage source configured to provide a first reference voltage. In addition, the integrated circuit includes a second voltage source configured to provide a second reference voltage. Furthermore, the integrated circuit includes a first capacitor being electrically coupled to the first input and disengageably coupled to the first voltage input. For example, the coupling to the first voltage input being is with a first clock signal. Moreover, the integrated circuit includes a second capacitor being electrically coupled to the first input and disengageably coupled to the first voltage input. The coupling to the first voltage input is associated with the first clock signal. In addition, the integrated circuit includes a third capacitor being electrically coupled to the second input and disengageably coupled to the second voltage input. The coupling to the second voltage input is associated with the first clock signal. The integrated circuit also includes a fourth capacitor being electrically coupled to the second input and disengageably coupled to the second voltage input. Depending upon application, the coupling to the second voltage input is associated with the first clock signal.

Moreover, the integrated circuit includes a first switch including a first switching position and a second switching position. The integrated circuit also includes a second switch including a third switching position and a third switching position. If the first switch is at the first switching position, the first capacitor is disengageably coupled to the first output and the second capacitor is disengageably coupled to the first voltage source. If the first switch is at the second switching position, the first capacitor is disengageably coupled to the first voltage source and the second capacitor is disengageably coupled to the first output. If the second switch is at the third switching position, the third capacitor is disengageably coupled to the second output and the second capacitor is disengageably coupled to the second voltage source. If the second switch is at the fourth switching position, the third capacitor is disengageably coupled to the second voltage source and the second capacitor is disengageably coupled to the second output. For example, the embodiment can be illustrated according to FIGS. 4-8.

According to another embodiment, the present invention provides a method for determining an optimal configuration for an integrated circuit. The method includes a step for providing the integrated circuit. The integrated circuit includes a different operational amplifier including a first output, a second output, a first input, and a second input. For example, the operational amplifier is associated with an amplification factor. The integrated circuit also includes a first voltage input, which can be characterized by a first voltage. Additionally, the integrated circuit includes a second voltage input, which can be characterized by a second voltage. The integrated circuit additionally includes a first voltage source configured to provide a first reference voltage. The integrated circuit also includes a second voltage source configured to provide a second reference voltage. Moreover, the integrated circuit includes a first capacitor that is electrically coupled to the first input and disengageably coupled to the first voltage input. Additionally, the integrated circuit includes a second capacitor that is electrically coupled to the first input and disengageably coupled to the first voltage input. Additionally, the integrated circuit includes a third capacitor that is electrically coupled to the second input and disengageably coupled to the second voltage input. Additionally, the integrated circuit includes a fourth capacitor that is electrically coupled to the second input and disengageably coupled to the second voltage input.

In addition, the integrated circuit includes a first switch that includes a first switching position and a second switching position. Moreover, the integrated circuit includes a second switch that includes a third switching position and a third switching position. If the first switch is at the first switching position, the first capacitor is disengageably coupled to the first output and the second capacitor is disengageably coupled to the first voltage source. If the first switch is at the second switching position, the first capacitor is disengageably coupled to the first voltage source and the second capacitor is disengageably coupled to the first output. If the second switch is at the third switching position, the third capacitor is disengageably coupled to the second output and the second capacitor is disengageably coupled to the second voltage source. If the second switch is at the fourth switching position, the third capacitor is disengageably coupled to the second voltage source and the second capacitor is disengageably coupled to the second output.

The method further includes a step for selecting a first configuration, wherein the first switch is at the first switching position and the second switch is a the third switching position. The method also includes a step for determining a first output deviation associated with the first configuration. The method additionally includes a step for selecting a second configuration, wherein the first switch is at the second switching position and the second switch is a the third switching position. The method further includes a step for determining a second output deviation associated with the second configuration. The method additionally includes a step for selecting a third configuration, wherein the first switch is at the first switching position and the second switch is a the fourth switching position. The method includes a step for determining a third output deviation associated with the third configuration. The method also includes a step for selecting a fourth configuration, wherein the first switch is at the second switching position and the second switch is a the fourth switching position. The method additionally includes a step for determining a fourth output deviation associated with the fourth configuration. Furthermore, the method includes a step for selecting an optimal configuration based on the first, second, third, and fourth output deviations. For example, the embodiment can be illustrated according to FIGS. 4-8.

According to yet another appointment, the present invention provides a method for determining an optimal configuration for an integrated circuit. The method includes a step for providing the integrated circuit. The integrated circuit includes a different operational amplifier including a first output, a second output, a first input, and a second input. The operational amplifier is associated with an amplification factor. The integrated circuit also includes a first voltage input that can be characterized by a first voltage. The integrated circuit includes a second voltage input that can be characterized by a second voltage. The integrated circuit additionally includes a first voltage source configured to provide a first reference voltage. The integrated circuit also includes a second voltage source configured to provide a second reference voltage. The integrated circuit additionally includes a first capacitor that is electrically coupled to the first input and disengageably coupled to the first voltage input. The integrated circuit includes a second capacitor that is electrically coupled to the first input and disengageably coupled to the first voltage input. The integrated circuit additionally includes a third capacitor that is electrically coupled to the second input and disengageably coupled to the second voltage input. The integrated circuit includes a fourth capacitor that is electrically coupled to the second input and disengageably coupled to the second voltage input.

The method additionally includes a step for providing a switch matrix adjustment configured to provide four or more configurations. If a first configuration is selected, the first capacitor is disengageably coupled to the first output, the second capacitor is disengageably coupled to the first reference voltage, the third capacitor is disengageably coupled to the second output, and the fourth capacitor is disengageably coupled to the second reference voltage. If a second configuration is selected, the first capacitor is disengageably coupled to the first reference voltage, the second capacitor is disengageably coupled to the first output, the third capacitor is disengageably coupled to the second output, and the fourth capacitor is disengageably coupled to the second reference voltage. If a third configuration is selected, the first capacitor is disengageably coupled to the first output, the second capacitor is disengageably coupled to the first reference voltage, the third capacitor is disengageably coupled to the second reference voltage, and the fourth capacitor is disengageably coupled to the second output. If a first configuration is selected, the first capacitor is disengageably coupled to the first reference voltage, the second capacitor is disengageably coupled to the first output, the third capacitor is disengageably coupled to the second reference voltage, and the fourth capacitor is disengageably coupled to the second output. Additionally, the method includes a step for selecting an optimal configuration from the four or more configurations. For example, the embodiment can be illustrated according to FIGS. 4-8.

The previous invention provides various advantages over conventional techniques. According to various embodiments, the present provides a system and method for ADCs with a higher degree of accuracy, uniformity, and linearity. More specifically, various embodiments of the present invention allows improving ADC performance after the ADC has been manufactured. In addition, various embodiments of the present invention provides power saving for ADC units by allowing ADCs to be implemented with smaller capacitor components. There are other benefits as well.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit comprising:
 a different operational amplifier including a first output, a second output, a first input, and a second input, the operational amplifier being associated with an amplification factor;
 a first voltage input, the first voltage input being characterized by a first voltage;
 a second voltage input, the second voltage input being characterized by a second voltage;
 a first voltage source configured to provide a first reference voltage;
 a second voltage source configured to provide a second reference voltage;
 a first capacitor being electrically coupled to the first input and disengageably coupled to the first voltage input, the coupling to the first voltage input being associated with a first clock signal;
 a second capacitor being electrically coupled to the first input and disengageably coupled to the first voltage input, the coupling to the first voltage input being associated with the first clock signal;
 a third capacitor being electrically coupled to the second input and disengageably coupled to the second voltage input, the coupling to the second voltage input being associated with the first clock signal;
 a fourth capacitor being electrically coupled to the second input and disengageably coupled to the second voltage input, the coupling to the second voltage input being associated with the first clock signal;
 a first switch including a first switching position and a second switching position;
 a second switch including a third switching position and a third switching position;
 wherein:
  if the first switch is at the first switching position, the first capacitor is disengageably coupled to the first output and the second capacitor is disengageably coupled to the first voltage source;
  if the first switch is at the second switching position, the first capacitor is disengageably coupled to the first voltage source and the second capacitor is disengageably coupled to the first output;
  if the second switch is at the third switching position, the third capacitor is disengageably coupled to the second output and the second capacitor is disengageably coupled to the second voltage source;
  if the second switch is at the fourth switching position, the third capacitor is disengageably coupled to the second voltage source and the second capacitor is disengageably coupled to the second output.

2. The integrated circuit of claim 1 wherein the first output is characterized by a first output voltage and the second output is characterized by a second voltage, the first voltage and the second voltage having opposite signs.

3. The integrated circuit of claim 1 wherein the first capacitor and the third capacitor are sample capacitors.

4. The integrated circuit of claim 1 wherein the second capacitor and the third capacitor are feedback capacitor.

5. The integrated circuit of claim 1 wherein the integrated circuit is an analog-to-digital conversion component.

6. The integrated circuit of claim 1 wherein the integrated circuit is an analog-to-digital conversion component configured to provide a two-bit output.

7. The integrated circuit of claim 1 wherein the integrated circuit is electrically coupled to a digital correction unit.

8. The integrated circuit of claim 1 wherein the integrated circuit is electrically coupled to an analog-to-digital conversion component.

9. The integrated circuit of claim 1 wherein the integrated circuit is electrically coupled to an analog-to-digital component.

10. The integrated circuit of claim 1 wherein the first output is characterized by a positive voltage and the second output is characterized by a negative voltage.

11. The integrated circuit of claim 1 wherein the first voltage is positive and the second voltage is negative.

12. The integrated circuit of claim 1 further comprising a clock switch positioned between the first switch and the first capacitor, the clock switch being configured to electrical couple the first switch and the first capacitor in response to a second clock signal.

13. A method for determining an optimal configuration for an integrated circuit, the method comprising:
 providing the integrated circuit, wherein the integrated circuit includes:
  a different operational amplifier including a first output, a second output, a first input, and a second input, the operational amplifier being associated with an amplification factor;
  a first voltage input, the first voltage input being characterized by a first voltage;
  a second voltage input, the second voltage input being characterized by a second voltage;
  a first voltage source configured to provide a first reference voltage;
  a second voltage source configured to provide a second reference voltage;
  a first capacitor being electrically coupled to the first input and disengageably coupled to the first voltage input;
  a second capacitor being electrically coupled to the first input and disengageably coupled to the first voltage input;
  a third capacitor being electrically coupled to the second input and disengageably coupled to the second voltage input;
  a fourth capacitor being electrically coupled to the second input and disengageably coupled to the second voltage input;
  a first switch including a first switching position and a second switching position; and
  a second switch including a third switching position and a third switching position;

wherein:
if the first switch is at the first switching position, the first capacitor is disengageably coupled to the first output and the second capacitor is disengageably coupled to the first voltage source;
if the first switch is at the second switching position, the first capacitor is disengageably coupled to the first voltage source and the second capacitor is disengageably coupled to the first output;
if the second switch is at the third switching position, the third capacitor is disengageably coupled to the second output and the second capacitor is disengageably coupled to the second voltage source;
if the second switch is at the fourth switching position, the third capacitor is disengageably coupled to the second voltage source and the second capacitor is disengageably coupled to the second output;
selecting a first configuration wherein the first switch is at the first switching position and the second switch is a the third switching position;
determining a first output deviation associated with the first configuration;
selecting a second configuration wherein the first switch is at the second switching position and the second switch is a the third switching position;
determining a second output deviation associated with the second configuration;
selecting a third configuration wherein the first switch is at the first switching position and the second switch is a the fourth switching position;
determining a third output deviation associated with the third configuration;
selecting a fourth configuration wherein the first switch is at the second switching position and the second switch is a the fourth switching position;
determining a fourth output deviation associated with the fourth configuration;
selecting an optimal configuration based on the first, second, third, and fourth output deviations.

14. The method of claim 13 wherein the selecting an optimal configuration comprises selecting a configuration associated with a smallest output deviation.

15. The method of claim 13 wherein the selecting an optimal configuration comprises selecting a configuration associated with a greatest output deviation.

16. The method of claim 13 wherein the integrated circuit is an analog-to-digital component.

17. The method of claim 13 wherein the integrated circuit is electrically coupled to a sample and hold circuit.

18. A method for determining an optimal configuration for an integrated circuit, the method comprising:
providing the integrated circuit, wherein the integrated circuit includes:
a different operational amplifier including a first output, a second output, a first input, and a second input, the operational amplifier being associated with an amplification factor;
a first voltage input, the first voltage input being characterized by a first voltage;
a second voltage input, the second voltage input being characterized by a second voltage;
a first voltage source configured to provide a first reference voltage;
a second voltage source configured to provide a second reference voltage;
a first capacitor being electrically coupled to the first input and disengageably coupled to the first voltage input;
a second capacitor being electrically coupled to the first input and disengageably coupled to the first voltage input;
a third capacitor being electrically coupled to the second input and disengageably coupled to the second voltage input;
a fourth capacitor being electrically coupled to the second input and disengageably coupled to the second voltage input;
providing a switch matrix adjustment configured to provide four or more configurations, wherein:
if a first configuration is selected, the first capacitor is disengageably coupled to the first output, the second capacitor is disengageably coupled to the first reference voltage, the third capacitor is disengageably coupled to the second output, and the fourth capacitor is disengageably coupled to the second reference voltage;
if a second configuration is selected, the first capacitor is disengageably coupled to the first reference voltage, the second capacitor is disengageably coupled to the first output, the third capacitor is disengageably coupled to the second output, and the fourth capacitor is disengageably coupled to the second reference voltage;
if a third configuration is selected, the first capacitor is disengageably coupled to the first output, the second capacitor is disengageably coupled to the first reference voltage, the third capacitor is disengageably coupled to the second reference voltage, and the fourth capacitor is disengageably coupled to the second output;
if a fourth configuration is selected, the first capacitor is disengageably coupled to the first reference voltage, the second capacitor is disengageably coupled to the first output, the third capacitor is disengageably coupled to the second reference voltage, and the fourth capacitor is disengageably coupled to the second output; and
selecting an optimal configuration from the four or more configurations.

19. The method of claim 18 wherein the optimal configuration is based on a different output, the different output being associated with the first output and the second output.

20. The method of claim 18 wherein the optimal configuration is based on a output deviation, the output deviation being associated with the first output and the second output.

* * * * *